United States Patent [19]
Johnson et al.

[11] Patent Number: 5,406,209
[45] Date of Patent: Apr. 11, 1995

[54] METHODS AND APPARATUS FOR TESTING CIRCUIT BOARDS

[75] Inventors: Nigel P. Johnson; Dan Leonida, both of Ottawa; Richard R. Goulette, Arnprior; Stanislus K. Xavier, Kanata, all of Canada

[73] Assignee: Northern Telecom Limited, Montreal, Canada

[21] Appl. No.: 13,711

[22] Filed: Feb. 4, 1993

[51] Int. Cl.$^6$ ............................................. G01R 31/28
[52] U.S. Cl. ..................... 324/750; 324/501
[58] Field of Search ..................... 324/158 F, 537, 538, 324/501, 500, 750

[56] References Cited

U.S. PATENT DOCUMENTS

| | | | |
|---|---|---|---|
| 3,463,007 | 8/1969 | Jones et al. | 324/501 |
| 4,583,042 | 4/1986 | Riemer | 324/519 |
| 5,006,788 | 4/1991 | Goulette et al. | 324/95 |
| 5,148,102 | 9/1992 | Rose et al. | 324/158 F |
| 5,218,294 | 6/1993 | Soiferman | 324/158 R |

Primary Examiner—Ernest F. Karlsen
Attorney, Agent, or Firm—C. W. Junkin

[57] ABSTRACT

In methods and apparatus for non-contact testing of an electronic circuit board at least one electromagnetic emission sensing probe is disposed a short distance from a circuit board under test, the circuit board is operated while sensing electromagnetic emission from a region of the circuit board near the probe, and a time domain representation of the sensed electromagnetic emission is developed. The time domain representation of the sensed electromagnetic emission is compared to a time domain representation of electromagnetic emission of a circuit board known to be operating properly. Preferably, an array of electric field sensing probes is used to sense emissions from several regions of the circuit board simultaneously, and time domain representations of the sensed electromagnetic emissions are simultaneously developed and compared to respective time domain representations of electromagnetic emissions from circuit boards known to be operating properly.

47 Claims, 8 Drawing Sheets

METHODS AND APPARATUS FOR TESTING CIRCUIT BOARDS

FIELD OF THE INVENTION

This invention relates to methods and apparatus for automated non-contact testing of electronic circuit boards.

BACKGROUND OF THE INVENTION

Electronic circuit boards are conventionally tested by physically contacting test points on the circuit board with electric probes to sense voltages at those test points. The sensed voltages for the circuit board under test are compared to calculated voltages or voltages sensed from a circuit board known to be operating properly to determine whether the circuit board under test is operating properly.

Sophisticated testing apparatus has been developed for automated contact testing of circuit boards. Such automated testing apparatus may have an array of probes arranged in a "bed-of-nails" configuration for simultaneously contacting several different test points on the circuit board under test. In spite of such sophistication, however, the speed of contact testing is limited by the rate at which voltages can be sensed by the contact probes and transmitted to remote test apparatus. The maximum testing speed is often lower than the data rates used in modern high speed circuits, so that contact testing cannot assess the operation of the circuit under test at its normal operating speed. Moreover, space must be provided on the circuit boards for test points, the "bed-of-nails" must be properly configured to align with the test points, and the "bed-of-nails" must make good ohmic contact with each of the test points without damaging the circuit board under test for successful automated contact testing. Consequently high speed, non-contacting test methods and apparatus are desirable.

U.S. Pat. No. 5,006,788 discloses apparatus for automated non-contact testing of electronic circuit boards. The disclosed apparatus comprises a rectangular array of wire loop probes, a tuned receiver, and addressing circuitry for connecting individual probes of the array to the receiver. The apparatus further comprises a signal processor for processing signals detected by the probes, and a display for displaying the received signals as a two-dimensional map. U.S. Pat. No. 5,006,788 was issued on Apr. 9, 1991, in the name of Richard R. Goulette et al and is entitled "Method and Apparatus for Monitoring Electromagnetic Emission Levels".

The apparatus disclosed by U.S. Pat. No. 5,006,788 is operated by placing the array of wire loop probes adjacent to an electronic circuit board and, with the electronic circuit board in operation, successively connecting individual probes of the probe array to the tuned receiver. Local magnetic fields due to electromagnetic emission from the operating circuit board induce currents in the wire loop probes, and these currents are successively sensed by the tuned receiver. The signal processor assembles the successively sampled currents into a data file which is displayed as a two-dimensional map of electromagnetic emissions at the frequency to which the receiver is tuned.

The displayed two-dimensional map of electromagnetic emissions is primarily useful for locating the components on a circuit board which contribute to excessive electromagnetic emissions. Once such components are located, they can be redesigned or replaced in an effort to reduce electromagnetic emissions for compliance with government standards (e.g. electromagnetic emission standards set by the Federal Communications Commission in the U.S.A).

U.S. Pat. No. 5,006,788 suggests that the disclosed apparatus can also be used to distinguish properly operating circuit boards from improperly operating circuit boards. The improperly operating circuit boards should have a different pattern of current flow leading to a different pattern of electromagnetic emissions as compared to properly operating circuit boards. Assuming that all properly operating circuit boards have a sufficiently similar pattern of electromagnetic emissions, the improperly operating circuit boards should be distinguishable as those circuit boards which do not have the pattern of electromagnetic emissions which is characteristic of properly operating circuit boards.

Unfortunately, as measured by the apparatus disclosed in U.S. Pat. No. 5,006,788, the electromagnetic emissions of properly operating circuit boards do not always have a pattern of electromagnetic emissions which is distinct enough to permit reliable discrimination of properly and improperly operating circuit boards. In fact, the difference in electromagnetic emission maps at a specific frequency for two properly operating circuit boards (as measured by the apparatus disclosed in U.S. Pat. No. 5,006,788) is sometimes greater than the difference in emission maps for properly and improperly operating circuit boards so that improperly operating circuit boards cannot be readily distinguished from properly operating circuit boards in some cases.

SUMMARY OF THE INVENTION

This invention provides novel methods and apparatus for automated non-contact testing of electronic circuit boards. The novel methods and apparatus are intended to overcome the difficulties with known methods and apparatus as described above.

More particularly, the novel methods and apparatus are intended to provide non-contact testing of electronic circuit boards with better discrimination between properly operating circuit boards and improperly operating circuit boards.

One aspect of the invention provides a method for non-contact testing of electronic circuit boards. The method comprises disposing at least one electromagnetic emission sensing probe a short distance from a circuit board under test, operating the circuit board while sensing electromagnetic emission from a region of the circuit board near the probe, developing a time domain representation of the sensed electromagnetic emission, and comparing the time domain representation of the sensed electromagnetic emission to a time domain representation of electromagnetic emission of a circuit board known to be operating properly.

The time domain representation of the sensed electromagnetic emission contains more information than the limited frequency domain representation provided by the method disclosed in U.S. Pat. No. 5,006,788. In particular, the time domain representation includes phase information which is not available in a frequency domain representation. Such phase information is often critical to proper assessment and diagnosis of circuit board operation. Moreover, the effect of individual signals can be easier to detect in the time domain representation than in the frequency domain representation because the time domain representation is less dominated by harmonics of clock signals and other repetitive signals. In practice, the time domain representation generally shows a greater similarity in the electromagnetic emission from two properly operating circuit boards than in the electromagnetic emission from two circuit boards, only one of which operates properly. Consequently, the method according to the invention permits more accurate discrimination between properly operating circuit boards and improperly operating circuit boards.

A single electromagnetic emission sensing probe may be disposed successively in different locations, each location being a short distance from a corresponding region of the circuit board. The circuit board may be operated while successively sensing electromagnetic emission at each location of the probe, and time domain representations of the sensed electromagnetic emission may be developed successively, and compared successively to time domain representations of electromagnetic emission of a circuit board known to be operating properly.

Alternatively, a plurality of electromagnetic emission sensing probes may be disposed a short distance from the circuit board to sense electromagnetic emission from a plurality of regions of the circuit board. Electromagnetic emission may be sensed with each of the probes simultaneously, time domain representations of electromagnetic emission sensed by each probe may be developed simultaneously, and the time domain representations of the sensed electromagnetic emissions may be compared simultaneously to respective time domain representations of electromagnetic emission of a circuit board known to be operating properly. Such simultaneous sensing and processing offers the potential for much faster testing of circuit boards.

Alternatively, the successive and simultaneous processing methods may be combined by providing a plurality of simultaneously operable probes and successively operating the plurality of probes in different locations to measure electromagnetic emission from a larger area or with higher resolution than could be sampled by the plurality of probes in a single location. Thus, the plurality of probes may be disposed successively in different locations, each location being a short distance from a corresponding region of the circuit board, the circuit board may be operated while simultaneously sensing electromagnetic emission with each probe at each successive location of the plurality of probes, and time domain representations of electromagnetic emission sensed by each probe may be developed simultaneously at each successive location of the plurality of probes. The time domain representations of the sensed electromagnetic emission sensed by each probe may be compared simultaneously to time domain representations of electromagnetic emission of a circuit board known to be operating properly at each successive location of the plurality of probes.

The number of probes and amount of simultaneous processing for a given test application will depend on testing time vs test hardware cost considerations.

Test inputs may be supplied to the circuit board while sensing electromagnetic emissions from the circuit board. Normally, the test inputs will comprise timing signals for synchronizing operation of the circuit board to operation of apparatus used to develop the time domain representations of the sensed electromagnetic emission. The test inputs may further comprise additional signals for exercising predetermined elements of the circuit board. The additional signals may be test patterns provided by external test apparatus, or signals for exercising built in self test (BIST) elements of the circuit board.

Preferably, the electromagnetic emission sensing probe senses an electric field of the electromagnetic emission.

The electric field of the sensed electromagnetic emission can be directly related to voltages in the region of circuit board which generate the electromagnetic emission. As such voltages relate more directly to operational characteristics of the circuit board under test than the currents sensed by the magnetic field sensing wire loop probes disclosed in U.S. Pat. No. 5,006,788, sensing of the electric field provides test data which is easier to interpret.

Where the electromagnetic emission sensing probes are provided as an array, electric field sensing probes have further advantages over magnetic field sensing probes. As disclosed in U.S. Pat. No. 5,006,788, each magnetic field sensing probe should include two orthogonal wire loops for detection of currents in arbitrary directions, and this configuration limits the packing density of such probes when they are provided as an array. Electric field sensing probes require only a single straight wire and can therefore be packed into a denser array for higher resolution.

In the methods defined above, the step of comparing the time domain representations may comprise comparing samples of the sensed electromagnetic emission to upper and lower limits of sampled electromagnetic emission of circuit boards known to be operating properly to determine whether the sensed electromagnetic emission falls between the upper and lower limits. The time domain representation of the sensed electromagnetic emission may be compared to a time domain representation of electromagnetic emission previously or simultaneously measured from at least one circuit board known to be operating properly, or to a calculated time domain representation simulating electromagnetic emission from a properly operating circuit board.

Another aspect of the invention provides apparatus for non-contact testing of electronic circuit boards. The apparatus comprises a controller for operating the circuit board, at least one non-contact electromagnetic emission sensing probe for sensing electromagnetic emission from a region of the circuit board near the probe while the circuit board is in operation, and a signal analyzer for developing a time domain representation of the sensed electromagnetic emission and for comparing the time domain representation of the sensed electromagnetic emission to a time domain representation of electromagnetic emission of a circuit board known to be operating properly.

The apparatus may comprise a single electromagnetic emission sensing probe and a drive mechanism for effecting relative movement of the probe and the circuit board for sampling of electromagnetic emission from different regions of the circuit board.

Alternatively, the apparatus may comprise an array of electromagnetic emission sensing probes.

The array of probes may be a linear or rectangular array, and the apparatus may further comprise a drive mechanism for effecting relative movement of the probe array and the circuit board for sampling of electromagnetic emission from different regions of the circuit board.

The apparatus may comprise a spacer element having a fixed spatial relationship with the probe such that the probe is disposed a short distance from the circuit board when the spacer contacts the circuit board. Where an array of probes is provided, a plurality of spacer elements may be provided, the spacer elements having fixed spatial relationships with respective probes of the array such that the probes are disposed a short distance from the circuit board when the spacer elements contact the circuit board. The spacer elements may be compliantly mounted for relative movement on contacting the circuit board such that the probe array can conform to surface relief of the circuit board.

Where an array of probes is provided, the probes may be operable such that electromagnetic emission from respective regions of the circuit board near each probe can be sensed simultaneously. The signal analyzer may be operable such that time domain representations of the electromagnetic emission sensed from several regions of the circuit board are developed simultaneously, and compared simultaneously to respective time domain representations of electromagnetic emission from a circuit board known to be operating properly.

The signal analyzer may comprise a single signal analysis element connected to all of the probes via a multiplexor, the multiplexor being operable by the controller for successively sensing and processing signals on each probe.

Alternatively, the signal analyzer may comprise a plurality of signal analysis elements, each signal analysis element being connected to a respective probe for analysis of signals sensed by only that probe. Each signal analysis element may have a respective carrier, the carriers being mountable in close proximity to form a dense array of probes.

In a mixed architecture, the signal analyzer may comprise a plurality of signal analysis elements, and each signal analysis element may be connected to a respective group of probes via a multiplexor, the multiplexor being operable by the controller for successively sensing and processing signals on each probe in the respective group of probes. The degree of multiplexing appropriate for a particular test application would depend on tradeoffs between test hardware cost and testing time. Each signal analysis element and its respective group of probes may have a respective carrier, the carriers being mountable in close proximity to form a dense array of probes.

Preferably the electromagnetic emission sensing probe or probes are electric field sensing probes.

BRIEF DESCRIPTION OF THE DRAWINGS

Embodiments of the invention are described below by way of example only. Reference is made to accompanying drawings, in which.

DESCRIPTION OF EMBODIMENTS

Figure 1:
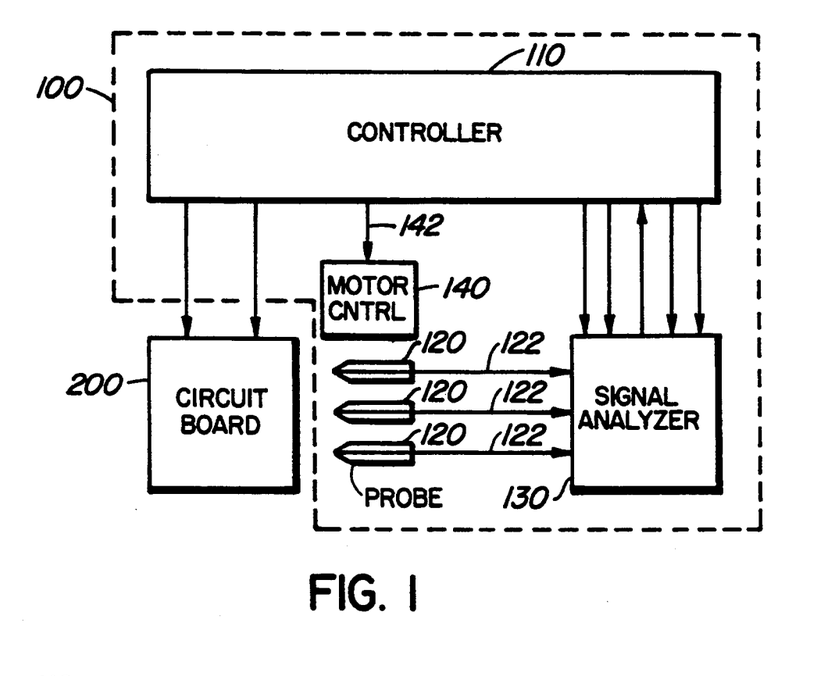
FIG. 1 is a block schematic diagram of apparatus for non-contact testing of electronic circuit boards.

FIG. 1 is a block schematic diagram of a tester 100 for non-contact testing an electronic circuit board 200. The tester 100 comprises a controller 110, an array of electromagnetic emission sensing probes 120, a signal analyzer 130, and a motor control circuit 140. For simplicity, only three of the probes 120 are shown, although over one thousand may be provided.

Figure 2:
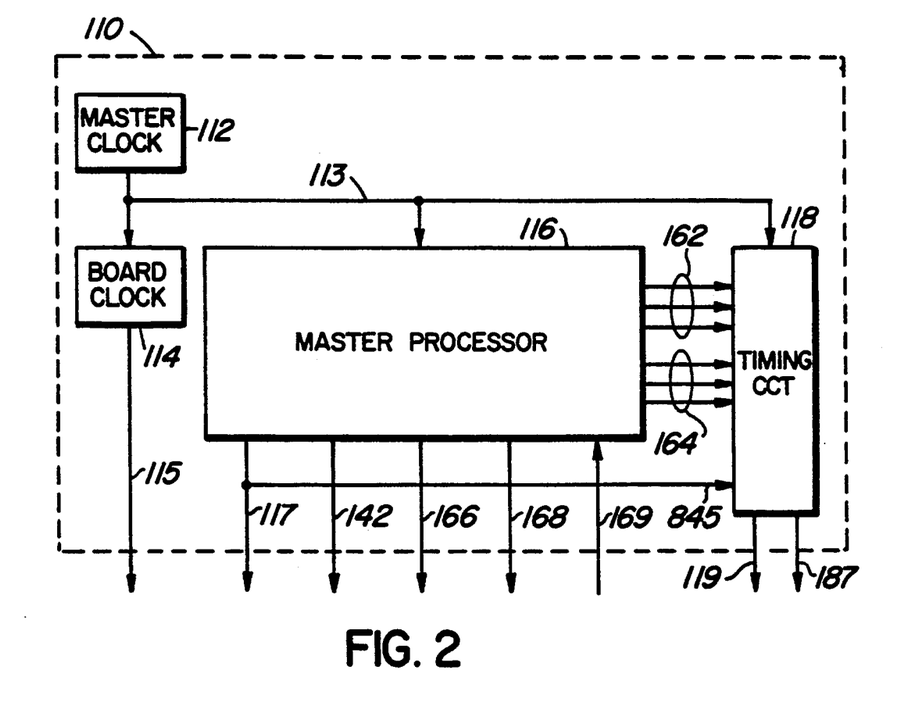
FIG. 2 is a block schematic diagram of a controller of the apparatus of FIG. 1.

FIG. 2 is a block schematic diagram showing the controller 110 in greater detail. The controller 110 comprises a master clock generator 112, a board clock generator 114, a master processor 116 and a timing circuit 118. The master clock generator 112 provides a master clock signal on a master clock bus 113 to run the board clock generator 114, the master processor 116 and the timing circuit 118. The master clock signal has a master clock rate, typically approximately 1 MHz.

The board clock generator 114 is a phase lock loop configured to generate a board clock signal which is synchronized to leading edges of the master clock signal and which has a board clock rate which is a multiple of the master clock rate. The board clock signal is applied via a board clock lead 115 to the circuit board 200 to run the circuit board 200. Preferably, the board clock rate is set as close as possible to the clock rate at which the circuit board 200 normally operates so that the operation of the circuit board 200 under test conditions approximates its operation under normal operating conditions. The master processor 116 applies test input signals to the circuit board 200 via one or more test input leads 117 to start operation of the circuit board 200 at a time which is synchronized to operation of the tester 100 and to exercise predetermined elements of the circuit board 200.

The timing circuit 118 generates sampling pulses for application to the signal analyzer 130 via a timing lead 119. The sampling pulses trigger sampling of the electromagnetic emissions sensed by the probes 120, and are synchronized to the master clock signal, but the precise timing of the timing pulses is controlled by the master processor 116, as explained in greater detail below.

Figure 3:
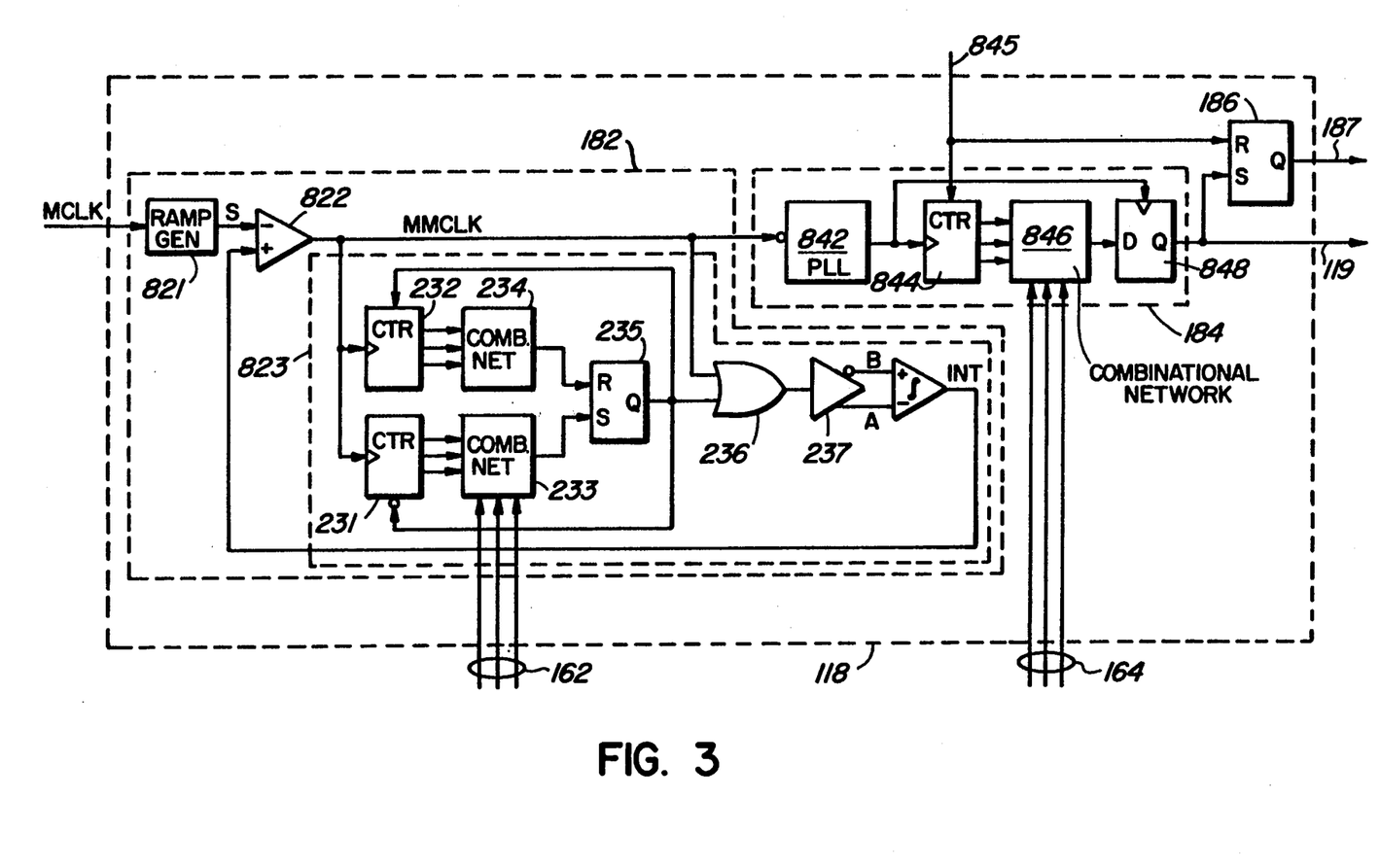
FIG. 3 is a block schematic diagram of a timing circuit of the controller of FIG. 2.

FIG. 3 is a block schematic diagram showing the timing circuit 118 in greater detail. The timing circuit 118 comprises a fine delay element 182, a sampling pulse generator 184 and an RS flip-flop 186.

The fine delay element 182 comprises a ramp generator 821 which generates a ramp signal R synchronized to the master clock signal MCLK. The fine delay element 182 further comprises a comparator 822 which compares the ramp signal R to a feedback signal INT to generate a modified master clock signal MMCLK at the master clock rate, the modified master clock signal MMCLK having a duty cycle which corresponds to a fine delay select code supplied by the main processor 116 on a fine delay select bus 162.

The feedback signal INT is generated by a feedback circuit 823 from the modified master clock signal MMCLK and from the fine delay select code. The feedback circuit 823 comprises a pair of counters 231, 232, a pair of combinational networks 233,234, an RS flip-flop 235, an OR gate 236, a differential buffer 237 and a differential integrator 238 connected as shown in FIG. 3. When enabled, one counter 231 counts pulses of the modified master clock signal MMCLK, and its combinational network 233 compares the current count to the fine delay select code, setting the RS flip-flop 235 when the current count matches the fine delay select code. The output of the flip-flop 235 is fed back to enable inputs of the counters 231, 232, so that setting the flip-flop 235 disables the one counter 231 and enables the other counter 232. The other counter 232 then counts pulses of the modified master clock signal MMCLK, and its combinational network 234 compares the current code to a fixed count, resetting the RS flip-flop 235 when the current count matches the fixed count. Resetting the flip-flop 235 enables the one counter 231 and disables the other counter 232 to restart the cycle. Consequently, the output of the flip-flop 235 is alternately held high for a number of master clock cycles which corresponds to the fine delay select code and held low for a number of master clock cycles which corresponds to the fixed count. The OR gate 236 combines the output of the flip-flop 235 with the modified master clock signal MMCLK, the differential buffer 237 provides a non-inverted version A and an inverted version B of the result, and the differential integrator 238 integrates the difference between these signals to generate the feedback signal INT.

Figure 4:
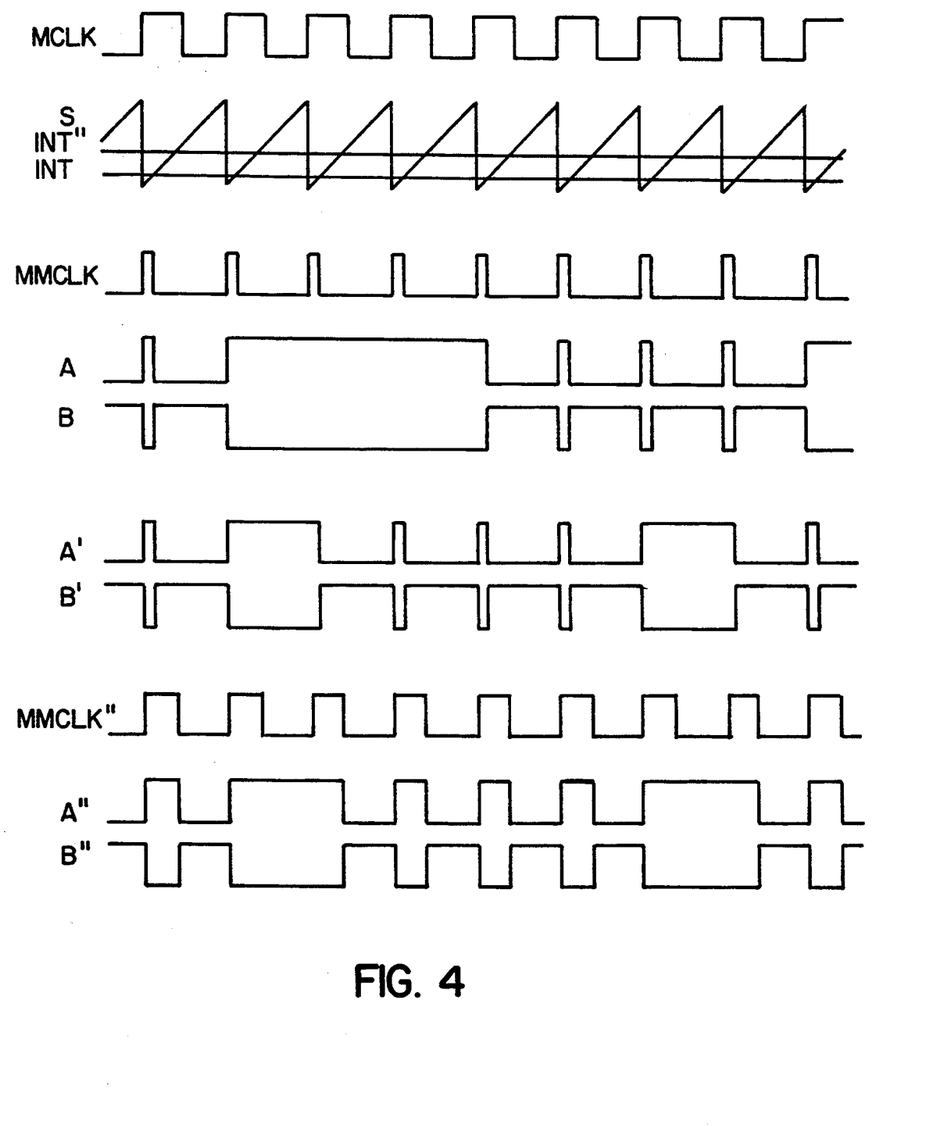
FIG. 4 is a timing diagram illustrating the operation of a delay element of the timing circuit of FIG. 3.

FIG. 4 is a timing diagram illustrating the operation of the delay element 182. If the delay select code is set at 3 and the fixed count is set at 4, the non-inverted output A of the differential buffer 237 is held high for three cycles of the modified master clock signal MMCLK, and then follows the modified master clock signal MMCLK for four cycles. The feedback signal INT is the integrated difference between the non-inverted output A and its inversion B which, at steady state, must settle at a value which causes the comparator 822 to set the duty cycle of the modified master clock signal MMCLK so that the DC content of the non-inverted and inverted outputs A, B are equal. If the delay select code is then changed from 3 to 1, the non-inverted output A' is held high for only one cycle of the modified master clock signal MMCLK before following the modified master clock signal for four cycles. Consequently, the non-inverted and inverted outputs A', B' have non-equal DC content and the feedback signal INT begins to rise, increasing the duty cycle of the modified master clock signal MMCLK. The circuit stabilizes at a new value INT" of the feedback signal which provides a modified master clock signal MMCLK" having a duty cycle which is high enough that the DC content of the non-inverted and inverted inputs A", B" are brought back into balance. Consequently, the duty cycle of the modified master clock signal MMCLK is controlled in increments determined by the fine delay select code supplied by the master processor 116.

(The example illustrated in FIG. 4 is contrived for easy illustration of the operation of the delay element 182. In the tester 100, the delay element 182 is used to adjust the duty cycle of the modified master clock signal by increments which are 5% or less of a period of the master clock signal. Such adjustments require a much higher value of the fixed count programmed into one of the combinational networks 234, and are too small to be readily perceived in a timing diagram. However, the method used to make such adjustments is essentially as illustrated. Moreover, in a more flexible implementation of the delay element 182, the combinational network 234 which determines the fixed count may include programmable elements so that the fixed count can be adjusted to adjust the size of the increments by which the duty cycle is adjusted.)

The sampling pulse generator 184 comprises a phase lock loop 842 which is configured to provide sampling pulses synchronized to trailing edges of the modified main clock signal MMCLK and having a rate which is a multiple of the master clock rate, typically about 20 MHz. The sampling pulse generator 184 further comprises a counter 844 and a sampling pulse gate in the form of a combinational network 846 and a flip-flop 848. The counter 844 is reset by a signal on reset lead 845 supplied by the master processor 116, and counts sampling pulses provided by the phase lock loop 842. The combinational network 846 compares the count to a digital coarse delay select code supplied by the master processor 116 on coarse delay select bus 164, and provides a logical "1" only when the count matches the coarse delay select code. The flip-flop 848 passes a sampling pulse synchronized to the trailing edge of the delayed clock signal only when the count matches the coarse delay select code.

The delay provided by the fine delay element 182 is selected to divide each coarse delay interval into an integer number of fine delay intervals. The number of coarse delay intervals and fine delay intervals for a given sampling pulse passed by the combinational network 846 and flip-flop 848 are selected by the master processor 116 according to a sampling algorithm as explained in greater detail below.

Because operation of the circuit board 200 is synchronized to leading edges of the master clock signal MCLK and sampling pulses are synchronized to trailing edges of the modified master clock signal MMCLK, the sampling pulses have a variable delay with respect to the start of the circuit board operation. The variable delay is determined by the coarse and fine delay select codes.

The RS flip-flop 186 of the timing circuit 118 has a reset input connected to the reset lead 845 of the counter 844 and a set input connected to the timing lead 119. Consequently, the RS flip-flop 186 is reset together with the counter 844 and set each time a sampling pulse is generated by the sampling pulse generator 184.

The signal analyzer 130 comprises several signal analysis elements 132. Each signal analysis element 132 is connected to several of the probes 120, and analyzes electromagnetic emissions sensed by its associated probes 120.

Figure 5:
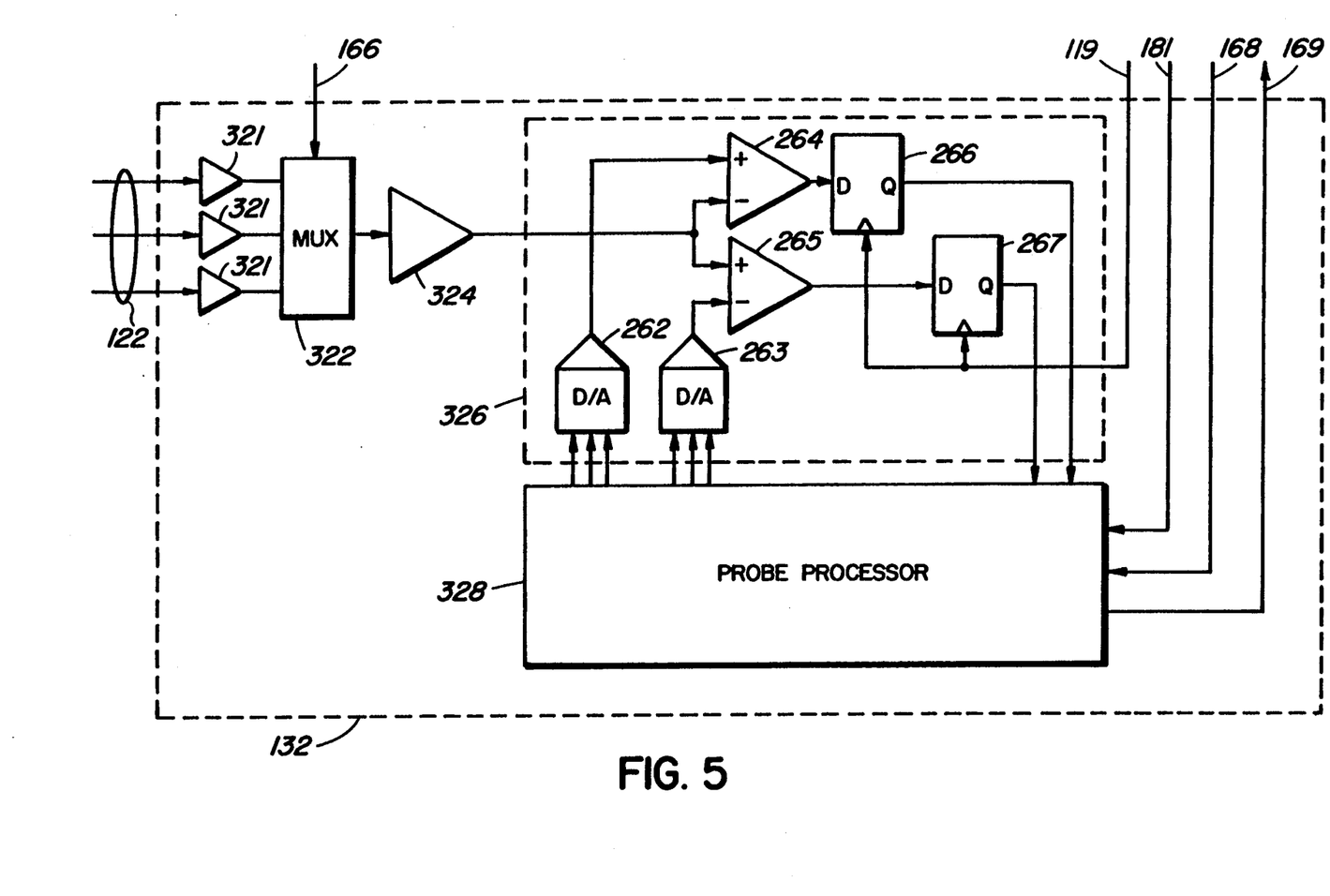
FIG. 5 is a block schematic diagram of a signal analysis element of the apparatus of FIG. 1.

FIG. 5 is a block schematic diagram of one signal analysis element 132 of the signal analyzer 130. The signal analysis element 132 comprises a plurality of buffers 321, a multiplexor 322, an amplifier 324, a comparison circuit 326 and a probe processor 328 including a memory. The multiplexor 322 responds to a signal provided by the master processor 116 on a probe selection lead 166 to select a signal on one of the probe leads 122 connected via a respective buffer 321 to the multiplexor 322. The amplifier 324 conditions the selected signal for further analysis. The comparison circuit 326 comprises upper and lower limit digital to analog converters 262, 263, upper and lower limit comparators 264, 265, and upper and lower limit flip-flops 266, 267 connected as shown in FIG. 4.

The signal analysis element 132 is operable in a data encoding mode and in a data comparison mode. In the data encoding mode, the lower limit digital to analog converter 262 converts digital codes supplied by the probe processor 328 to analog reference signals for comparison to the amplified signal by the lower limit comparator 264. The result of the comparison is provided to the lower limit flip-flop 266, which is timed by the sampling pulse provided by the timing circuit 118. The probe processor 328 polls the RS flip-flop 186 of the timing circuit 118 and samples the output of the lower limit flip-flop 266 when the RS flip-flop 186 is set by the sampling pulse. In the data encoding mode, arbitrary digital codes may be supplied by the probe processor 328 to the upper limit digital to analog converter 263, and the output of the upper limit flip-flop 267 may be ignored by the probe processor 328. Alternatively, the upper limit digital to analog converter 263, comparator 265 and flip-flop 267 may be disabled during operation of the signal analysis element 132 in the data encoding mode.

Figure 6:
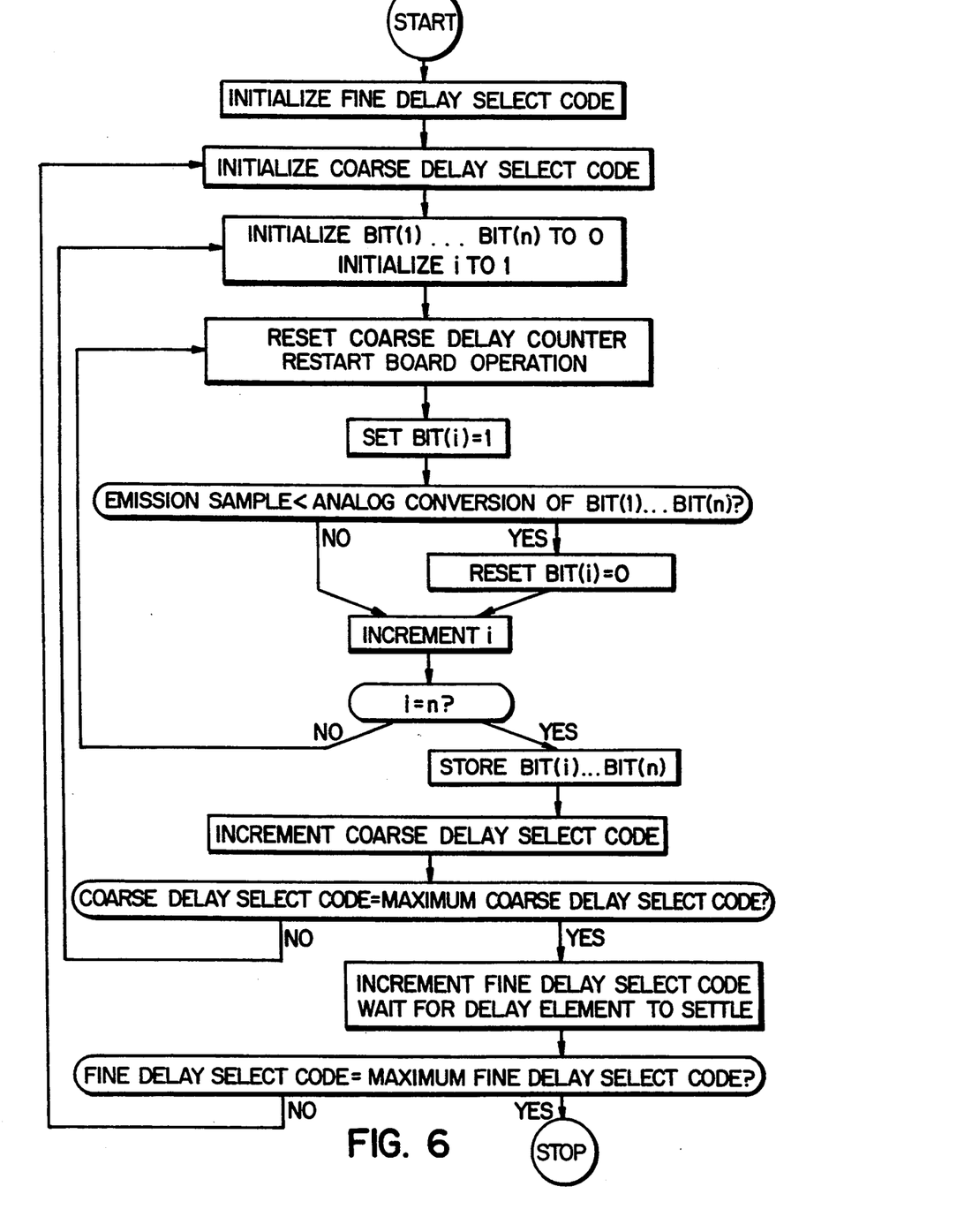
FIG. 6 is a flowchart showing an algorithm used by the apparatus of FIG. 1 for encoding samples of electromagnetic emission from an electronic circuit board.

During operation of the signal analysis element 132 in the data encoding mode, the probe processor 328 and the master processor 116 control the comparison circuit 326 according to a successive approximation algorithm to digitally encode the amplified signal. FIG. 6 is a flowchart illustrating the algorithm used. Each sample of the amplified signal is used to determine one bit of an n bit digital code representing the amplified signal at each sampling point. Consequently, n successive samples are taken at each sampling point before incrementing the delay select codes to move the sampling point.

The delay element 182 requires some time to settle after each change of the fine delay select code, so the coarse delay select code is changed more frequently than the fine delay select code. This minimizes the impact of the delay lock loop settling time on the data encoding rate.

When the signal analysis element 132 is operated in a data comparison mode, the probe processor 328 supplies stored digital codes to both upper and lower limit digital to analog converters 262, 263. The digital to analog converters 262, 263 convert the digital codes to upper and lower limit analog signals for comparison to the amplified signal by the upper and lower limit comparators 264,265 respectively. The results of the comparison are provided to the flip-flops 265, 266, which are timed by the sampling pulse provided by the timing circuit 118 to couple the results to the probe processor 328. The results of the comparison indicate whether the amplified signal is between upper and lower limits specified by the probe processor 328 at the sampling point.

Figure 7:
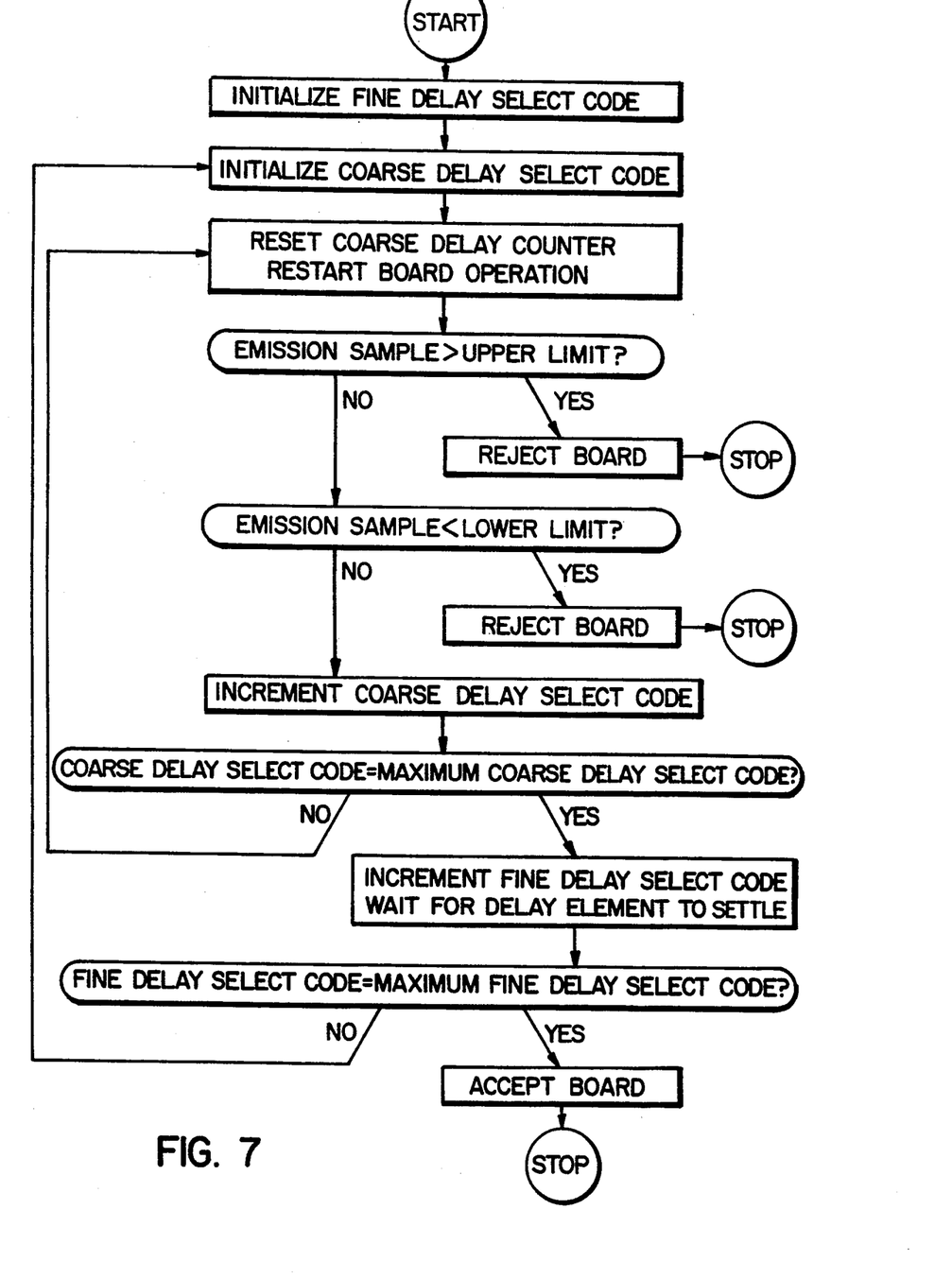
FIG. 7 is a flowchart showing an algorithm used by the apparatus of FIG. 1 for comparing samples of electromagnetic emission from an electronic circuit board to samples of electromagnetic emission from an electronic circuit board known to operating properly.

FIG. 7 is a flowchart showing the algorithm used in comparison mode. The circuit board 200 is rejected if any of the samples fall outside of the specified upper and lower limits for those samples. The circuit board 200 is accepted only if all samples are between the specified limits.

Communication between the master processor 116 and the probe processors 328 is provided via buses 168, 169.

Figure 8:
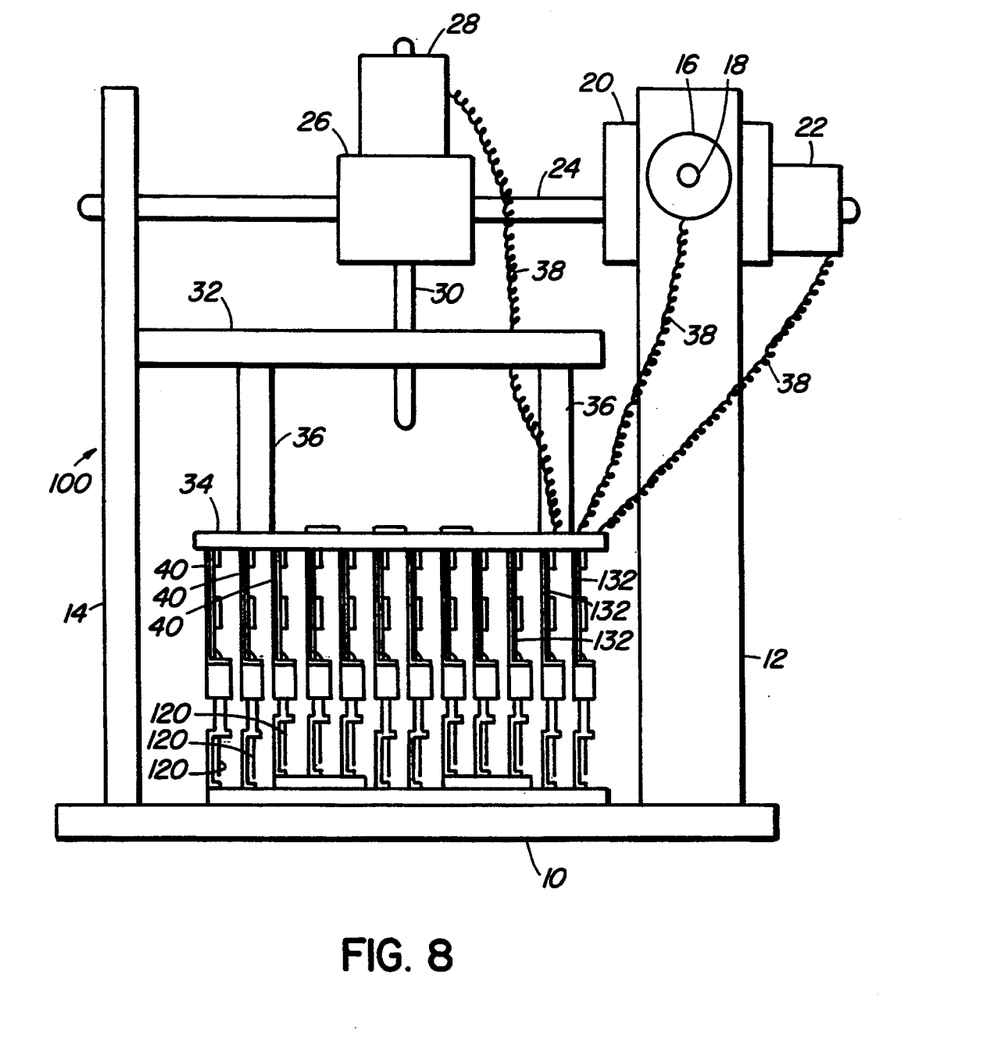
FIG. 8 is a side view of a physical embodiment of the apparatus of FIG. 1.

FIG. 8 is a side view of a physical embodiment the tester 100. The tester 100 includes a base 10, a first upright 12, a second upright (hidden behind the first upright) and a third upright 14 fixed to the base. A first electric motor 16 is fixed to the first upright 12 and drives a first threaded shaft 18 which passes through a threaded hole in a first block 20 and is rotatably received in the second upright. Operation of the first motor 16 causes translation of the first block 20 along an x-coordinate.

The first block 20 carries a second electric motor 22 which drives a second threaded shaft 24 which is perpendicular to the first threaded shaft 18. The second threaded shaft 24 passes through a threaded hole in a second block 26 and is slidably received in a horizontal slot of the third upright 14. Operation of the second electric motor 22 causes translation of the second block 26 along a y-coordinate.

The second block 26 carries a third electric motor 28 which drives a vertical threaded shaft 30. The vertical threaded shaft 30 passes through a threaded hole in a horizontal support member 32, one end of which is slidably received in a vertical slot of the third upright 14. Operation of the third electric motor 28 raises and lowers the horizontal support member 32.

A horizontal circuit carrier 34 is mounted to the horizontal support member 32 via vertical members 36. The horizontal circuit carrier 34 carries the controller 110 and the motor control circuit 140 of the tester 100. The motor control circuit 140 is connected to the electric motors 16, 22, 26 via extensible wires 38 which are long enough to permit movement of the circuit carrier 34 without breakage of the wires 38.

An array of vertical circuit carriers 40 is mounted to the horizontal circuit carrier 34. Each vertical circuit carrier 40 carries a signal analysis element 132 of the signal analyzer 130. The probes 120 associated with each signal analysis element 132 are mounted to an edge of each vertical circuit carrier 40 to depend from the vertical circuit carriers 40. In this location, the probes 120 can be positioned with the electric motors 16, 22, 26 near to the surface of the electronic circuit board 200 when it is placed on the base 10.

Figure 9:
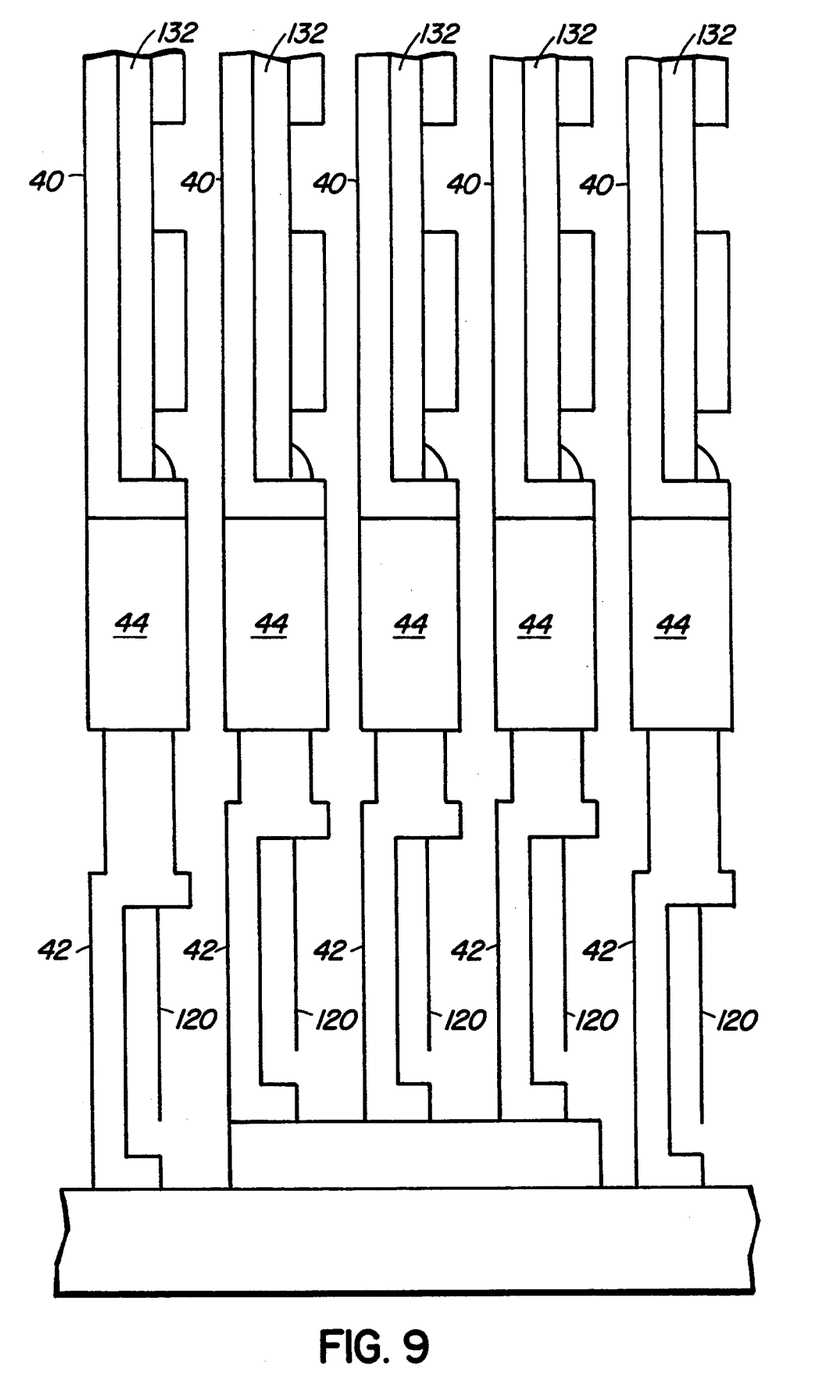
FIG. 9 is a fragmentary side view showing part of the physical embodiment of FIG. 8 in greater detail.

FIG. 9 shows the mounting of the probes 120 in greater detail. Dielectric spacer elements 42 are compliantly mounted to the edge of each vertical circuit carrier 40 by sprung piston-in-cylinder mechanisms 44 similar to those conventionally used for compliant mounting of contact probes used in "bed-of-nails" testers. The probes 120 are rigidly mounted to the spacer elements 42 to have a fixed spatial relationship with the spacer elements 42, so that the probes 120 are disposed a short distance from circuit board 200 when the spacer elements 42 contact the circuit board 200. The probes 120 are connected to corresponding signal analysis elements 132 via flexible wires 46. The compliant mounting of the probes 120 permits relative movement of the probes 120 so that the probe array can conform to surface relief of the circuit board 200 as illustrated in FIG. 8.

The following procedures are used to test a production run of circuit boards of the same design using the tester 100.

With the array of probes 120 raised, a circuit board 200 which is known to be operating properly is precisely located on the base 10 of the tester 100. The array of probes 120 is lowered onto the circuit board 200, and each signal analysis element 132 of the signal analyzer 130 is configured in data encoding mode.

The controller 110 exercises the circuit board 200 while running the sampling algorithm of FIG. 6. According to this algorithm, the signal analysis elements 132 sample electromagnetic emission from the circuit board 200 at predefined sampling intervals. Several samples are taken from each probe 120 at each sampling point to derive a multibit digital code corresponding to electromagnetic emission sensed on each probe 120 at each sampling point, and the multibit codes are stored by the probe processors 328. To sample emissions from all probes 120, the controller 110 must cycle the multiplexors 322 of each signal analysis element 132, and repeat the algorithm of FIG. 6 for each setting of the multiplexors 322.

If the array of probes 120 does not cover the entire circuit board 200 or if the spacing of the probes 120 is too large for adequate resolution, it may be necessary to take samples for several different placements of the array of probes 120 on the circuit board 200, using the electric motors 16, 22, 26 to precisely reposition the array of probes 120 on the circuit board 200. In this case, the sampling procedure is the same for each placement of the array of probes 120 on the circuit board 200.

Several circuit boards 200, all of which are known to be operating properly are sampled as described above to determine upper and lower limits for the sampled electromagnetic emissions from each probe 120 at each sampling point. The probe processors 327 may be provided with software for computing and storing the upper and lower limits from the sampled data, or the sampled data may be downloaded to an external processor for computation of the upper and lower limits, which are then uploaded for storage by the probe processors 327.

Once the upper and lower limits are established for electromagnetic emission sampled by each probe 120 at each sampling point for each placement of the probes 120, the tester 100 can be used to assess whether other circuit boards 200 of the production run are operating properly.

To assess one such circuit board 200', the circuit board 200' is located on the base 10 of the tester 100 in precisely the same position as the properly operating circuit boards 200 were located during derivation of the upper and lower limits for properly operating circuit boards. The probes 120 are positioned on the circuit board 200' in precisely the same location as used during derivation of the upper and lower limits, and each signal analysis element 132 of the signal analyzer 130 is configured in comparison mode.

The controller 110 exercises the circuit board 200' with the same signals as used during establishment of the upper and lower limits while running the comparison algorithm of FIG. 7. According to this algorithm, the signal analysis elements 132 sample electromagnetic emission from the circuit board 200' at predefined sampling intervals and compare the sampled electromagnetic emission to the established upper and lower limits. If any of the samples fall outside of the upper and lower limits, the probe processor 328 detecting the mismatch informs the controller 110 which raises an alarm.

To sample emissions from all probes 120, the controller 110 must cycle the multiplexors 322 of each signal analysis element 132, and repeat the algorithm of FIG. 7 for each setting of the multiplexors 322. The probes 120 are sampled in the same order as used to establish the upper and lower limits to ensure that the sampled electromagnetic emission is compared to corresponding upper and lower limits.

If samples were taken for several different placements of the array of probes 120 on the circuit board 200 to establish the upper and lower limits, the circuit board 200' must also be tested with exactly the same placements of the probes 120 on the circuit board 200'. In this case, the comparison procedure is the same for each placement of the probes 120 on the circuit board 200'.

Circuit boards 200' rejected by the comparison procedure may subsequently be tested by other means, and may be found to be operating properly. In that case, the rejected boards 200' can be sampled with the signal analysis elements 132 in data encoding mode to establish new, less stringent upper and lower limits for the sampled electromagnetic emission.

Numerous modifications may be made to the embodiment described without departing from the inventive concept.

For example, a respective signal analysis element 132 could be provided for each probe 120 to permit sampling of electromagnetic emission from all probes 120 simultaneously, development of all time domain representations simultaneously and comparison of all time domain representations simultaneously. In this case, the multiplexors 322 of the signal analysis elements 132 could be eliminated. At another architectural extreme, only one signal analysis element 132 could be provided and multiplexed to all probes 120. In this architecture, electromagnetic emission would be sampled from each of the probes 120, and corresponding time domain representations would be developed and compared in succession. The degree of multiplexing and parallel processing desirable for a given application depends on tradeoffs between the cost of the tester hardware and the desired testing speed or throughput.

Similarly, the number and configuration of probes 120 for a given testing application depends on tradeoffs between tester cost and desired testing speed. At one extreme, a rectangular array of probes 120 with sufficient size and density for testing the largest anticipated circuit boards 200 with adequate resolution could be provided so that each circuit board 200 can be fully tested with a single placement of the probes 120. At another extreme, a single probe 120 could be adequate if it is successively moved to different locations on the circuit board 200 for successive samples. In between, smaller or less dense rectangular arrays of probes 120, or linear arrays of probes 120 could be used with a smaller number of placements on the circuit boards 200 to achieve adequate test resolution and coverage.

In the embodiment described above, the position of the circuit board 200 is fixed, and the array of probes 120 is moved to effect probe placement. Alternatively, the array of probes 120 could have a fixed position, and the circuit board 200 could be moved to effect probe placement. Some functions of the controller 110 could be implemented on a generic processor such as a "personal computer" (PC). In this case, some or all of the controller 110 would be located remote from the array of probes 120 and its associated circuitry to avoid the need to move the controller 110 with the probes 120.

As the encoding mode and the comparison mode of the signal analysis elements 132 are used in successive testing operations, separate specialized signal analysis elements could be provided for each of the successive operations. In this case, signal analysis elements used only for data encoding would not need the upper limit digital to analog converters 263, comparators 265 and flip-flops 267. In high volume production operations, several testers may be used for data comparison operations while only one tester 110 is needed for data encoding operations, the results of the encoding operations being downloaded from the tester performing data encoding operations to the testers performing the data comparison operations. It may be cheaper to provide only those signal analysis capabilities needed for the intended use of a tester in that tester. In particular, each type of tester would need only the specialized hardware and software required for its particular application.

The test inputs provided to the circuit boards 200 during testing could be limited to the board clock input and a synchronizing signal used to restart the circuit boards 200 for each sample. Alternatively, the test inputs could be expanded to include test patterns designed to exercise predetermined elements of the circuit boards 200 or pseudorandom test patterns. Such expanded test inputs could be generated by the master processor 116 or by an external processor. If the circuit boards include built in self test (BIST) elements, the test inputs could also include signals for exercising these elements to generate test patterns on the circuit boards 200.

The probes 120 used in the embodiment described above are straight wire electric field sensing probes. Electric field sensing probes are preferred because the sensed electric fields can be related directly to voltages in the region of the circuit board 200 sensed by a given probe 120, and such voltages relate more directly to operational characteristics of the circuit boards 200 than do the currents sensed by wire loop magnetic field sensing probes. Nevertheless, magnetic field sensing probes could be used without departing from at least some aspects of the invention.

The electric field sensing probes could be provided with enlarged tips, possibly in the form of a small plate, for improved capacitive coupling to the circuit board under test.

The illustrated embodiment uses compliant mounting of the probes so that the probe array can conform to the surface topography of circuit boards under test to maximize coupling between the circuit boards under test and the probe array. If the surface topography of the circuit boards under test can vary significantly due to tolerances on component size and placement, the compliant action of the probe array may differ from circuit board to circuit board, and this may cause differences in detected emissions that have little correlation to operation of the circuit boards. Consequently, for some applications, non-compliant mounting of the probes may be preferred.

The analog to digital conversion technique used to digitally encode sampled electromagnetic emission in the above embodiment is considered particularly advantageous for low cost encoding of high speed repetitive waveforms. Low cost encoding is particularly important if a large number of signal analysis elements are required to achieve high speed, high resolution testing. Nevertheless, any other analog to digital conversion technique could be used without departing from at least some aspects of the invention.

For example, sampling algorithms other than those illustrated in FIGS. 6 and 7 could be employed. In the algorithms of FIGS. 6 and 7, operation of the circuit boards 200, 200' is periodically restarted at successive restart times, and electromagnetic emission is sampled from the circuit boards 200, 200' at a single sampling time between successive restart times. The sampling times have sampling delays with respect to the restart times, and the sampling delays are incremented through a series of coarse delay increments for each of a series of fine delay increments. Instead of taking a single sample between successive restart times, multiple samples could be taken between successive restart times. Such a sampling algorithm is potentially faster than the algorithm illustrated in FIGS. 6 and 7.

Window comparison is used in the above embodiment to speed up the comparison process. It would also be possible to digitally encode the electromagnetic emission sampled from the circuit boards 200' whose operation is uncertain and compare the digitally encoded samples to the digitally encoded upper and lower limits, though this may impact comparison speed.

The upper and lower limits used for comparison could be calculated from simulation of the operation of properly or improperly operating circuit boards, could be measured from one or more properly or improperly operating circuit boards, or could be derived from a combination of measurement and calculation.

The acceptance criteria could be more complex than a simple comparison of each electromagnetic emission sample with upper and lower limits. For example, the acceptance criteria could depend on relationships between several predetermined electromagnetic emission samples.

These and other modifications do not depart from the invention as defined below.

We claim:

1. A method for non-contact testing of electronic circuit boards, the method comprising:
   disposing at least one electromagnetic emission sensing probe a short distance from a circuit board under test;
   applying time dependent test signals to operate the circuit board while sensing electromagnetic emission from a region of the circuit board near the probe;
   developing a time domain representation of the sensed electromagnetic emission, the time domain representation comprising a signal representing evolution of the sensed electromagnetic emission from said region of said circuit board over a finite period of time; and
   comparing the time domain representation of the sensed electromagnetic emission to a time domain representation of electromagnetic emission from a corresponding region of a similar circuit board subject to the same time dependent test signals.

2. A method as defined in claim 1, comprising disposing a plurality of electromagnetic emission sensing probes a short distance from the circuit board to sense electromagnetic emission from a plurality of regions of the circuit board.

3. A method as defined in claim 2, comprising:
   simultaneously sensing electromagnetic emission with each of the probes;
   simultaneously developing a time domain representation of the electromagnetic emission sensed by each probe; and
   simultaneously comparing the time domain representations of the sensed electromagnetic emission to respective time domain representations of electromagnetic emission of a circuit board known to be operating properly.

4. A method as defined in claim 1, comprising:
   successively disposing the probe in different locations, each location being a short distance from a corresponding region of the circuit board; and
   repeating application of the time dependent test signals to operate the circuit board while successively sensing electromagnetic emission at each location of the probe;

successively developing time domain representations of the sensed electromagnetic emission; and successively comparing the time domain representations of the sensed electromagnetic emission to time domain representations of electromagnetic emission of a similar circuit board.

5. A method as defined in claim 2, comprising:

successively disposing the plurality of probes in different locations, each location being a short distance from a corresponding region of the circuit board;

repeating application of the time dependent test signals to operate the circuit board while simultaneously sensing electromagnetic emission with each probe at each successive location of the plurality of probes;

simultaneously developing time domain representations of the electromagnetic emission sensed by each probe at each successive location of the plurality of probes; and simultaneously comparing the time domain representations of the electromagnetic emission sensed by each probe to time domain representations of electromagnetic emission of a similar circuit board at each successive location of the plurality of probes.

6. A method as defined in claim 1, wherein the test signals comprise timing signals for synchronizing operation of the circuit board to operation of apparatus used to develop the time domain representations of the sensed electromagnetic emission.

7. A method as defined in claim 6, where the test signals comprise signals in addition to timing signals, the additional signals exercising predetermined elements of the circuit board.

8. A method as defined in claim 7, wherein the additional signals exercise built in self test elements of the circuit board.

9. A method as defined in claim 1, comprising sensing an electric field of the electromagnetic emission of the circuit board with the probe.

10. A method as defined in claim 1, wherein the step of developing a time domain representation comprises amplifying the sensed electromagnetic emission.

11. A method as defined in claim 1, wherein the step of developing a time domain representation comprises sampling and digitally encoding the sensed electromagnetic emission.

12. A method as defined in claim 11, comprising digitally encoding the sensed electromagnetic emission by successive approximation.

13. A method as defined in claim 12, comprising digitally encoding a single bit per sample of the sensed electromagnetic emission.

14. A method as defined in claim 6, comprising:

periodically restarting operation of the circuit board at successive restart times; and sampling electromagnetic emission from the circuit board at a predetermined number of sampling times between successive restart times, the sampling times having sampling delays with respect to the restart times, the sampling delays being varied according to a sampling algorithm.

15. A method as defined in claim 14, comprising incrementing the sampling delay between restart times.

16. A method as defined in claim 15, comprising:

sampling electromagnetic emission from the circuit board at a single sampling time between successive restart times; and incrementing the sampling delay through a series of fine delay increments, and incrementing the sampling delay through a series of coarse delay increments for each fine delay increment.

17. A method as defined in claim 1, wherein the step of comparing the time domain representations comprises comparing samples of the sensed electromagnetic emission to upper limits and lower limits of sampled electromagnetic emission of at least one circuit board known to be operating properly to determine whether the sensed electromagnetic emission falls between the upper and lower limits.

18. A method as defined in claim 1, wherein the time domain representation of the sensed electromagnetic emission is compared to a time domain representation of electromagnetic emission previously measured from at least one circuit board known to be operating properly.

19. A method as defined in claim 1, wherein the time domain representation of the sensed electromagnetic emission is compared to a calculated time domain representation simulating electromagnetic emission from a properly operating circuit board.

20. Apparatus for non-contact testing of an electronic circuit board, comprising:

a controller for applying time dependent test signals to operate the circuit board;

at least one non-contact electromagnetic emission sensing probe for sensing electromagnetic emission from a region of the circuit board near the probe while said time dependent test signals are applied to the circuit board; and a signal analyzer for developing a time domain representation of the sensed electromagnetic emission from said region, and for comparing the time domain representation of the sensed electromagnetic emission to a time domain representation of electromagnetic emission from a corresponding region of a similar circuit board subject to the same time dependent test signals, the time domain representation of the sensed electromagnetic emission comprising a signal representing evolution of the sensed electromagnetic emission over a finite period of time.

21. Apparatus as defined in claim 20, wherein the controller comprises:

a master clock generator for generating a master clock signal;

a board clock generator for generating a board clock signal for operating the circuit board under test, the board clock signal being synchronized to the master clock signal;

a timing circuit for generating sampling pulses for application to the signal analyzer to trigger sampling of the electromagnetic emissions sensed by the probe, the sampling pulses being synchronized to the master clock signal; and a master processor for controlling the timing circuit according to a sampling algorithm.

22. Apparatus as defined in claim 21, wherein:

the master clock signal has a master clock rate; and the board clock generator is a phase lock loop responsive to the master clock signal for generating a board clock signal having a board clock rate which is a multiple of the master clock rate.

23. Apparatus as defined in claim 21, wherein the master processor is operable to supply at least one test input signal to the circuit board under test to exercise the circuit board under test, each test input signal being synchronized to the master clock.

24. Apparatus as defined in claim 21, wherein the timing circuit comprises:
a sampling pulse generator for deriving sampling pulses from the master clock signal; and
a fine delay element responsive to a fine delay select code to delay the sampling pulses relative to the master clock signal by a fine delay corresponding to the fine delay select code, the master processor being operable to cycle the fine delay select code to sample the electromagnetic emissions sensed by the probe according to the sampling algorithm.

25. Apparatus as defined in claim 24, wherein:
the fine delay element is responsive to the fine delay select code and the master clock signal to generate a modified master clock signal at the master clock rate, the modified master clock signal having a duty cycle which corresponds to the fine delay select code; and
the sampling pulse generator comprises a phase lock loop operable to generate sampling pulses at a multiple of the master clock rate, the sampling pulses being synchronized to a trailing edge of the modified master clock signal.

26. Apparatus as defined in claim 25, wherein the sampling pulse generator further comprises:
a counter for counting sampling pulses;
a sampling pulse gate responsive to outputs of the counter and to a coarse delay select code to compare the outputs of the counter to the coarse delay select code and to pass a sampling pulse only when the outputs of the counter match the coarse delay select code, the master processor being operable to cycle the coarse delay select code according to the sampling algorithm.

27. Apparatus as defined in claim 26, wherein the master processor is operable to cycle the coarse delay select code through a full range of values for each value of the fine delay select code before changing the fine delay select code.

28. Apparatus as defined in claim 20, comprising a single electromagnetic emission sensing probe, the apparatus further comprising a drive mechanism for effecting relative movement of the probe and the circuit board for sampling of electromagnetic emission from different regions of the circuit board.

29. Apparatus as defined in claim 20, comprising an array of electromagnetic emission sensing probes.

30. Apparatus as defined in claim 29, wherein the array of probes is a linear array, and the apparatus further comprises a drive mechanism for effecting relative movement of the probe array and the circuit board for sampling of electromagnetic emission from different regions of the circuit board.

31. Apparatus as defined in claim 29, wherein the array of probes is a rectangular array.

32. Apparatus as defined in claim 29, wherein the apparatus further comprises a drive mechanism for effecting relative movement of the probe array and the circuit board for sampling of electromagnetic emission from different regions of the circuit board.

33. Apparatus as defined in claim 20, wherein the electromagnetic emission sensing probe is an electric field sensing probe.

34. Apparatus as defined in claim 29, wherein each probe of the array is an electric field sensing probe.

35. Apparatus as defined in claim 20, comprising a spacer element having a fixed spatial relationship with the probe such that the probe is disposed a short distance from the circuit board when the spacer element contacts the circuit board.

36. Apparatus as defined in claim 29, comprising a plurality of spacer elements having fixed spatial relationships with respective probes of the array such that the probes are disposed a short distance from the circuit board when the spacer elements contact the circuit board, the spacer elements being compliantly mounted for relative movement on contacting the circuit board such that the probe array can conform to surface relief of the circuit board.

37. Apparatus as defined in claim 20, wherein the signal analyzer comprises at least one signal analysis element, the signal analysis element comprising:
a comparison circuit for comparing signals sensed by the probe to stored signals; and
a probe processor for controlling the comparison circuit to effect analog to digital conversion of the sensed signals, storage of the digital signals, recall of the digital signals and comparison of the recalled signals with the sensed signals.

38. Apparatus as defined in claim 37, wherein the comparison circuit comprises:
a digital to analog converter for converting digital signals supplied by the probe processor to analog reference signals;
a comparator for comparing signals sensed by the probe to the analog reference signals; and
a flip-flop responsive to a sampling pulse for providing results of the signal comparison to the probe processor.

39. Apparatus as defined in claim 38, wherein the probe processor cooperates with the digital to analog converter and the comparator to digitally encode the signals sensed by the probe by successive approximation.

40. Apparatus as defined in claim 39, wherein the probe processor cooperates with the controller to perform successive comparisons of signals sensed by the respective probe to analog reference signals on successive samples to derive one bit of digital information from each sample.

41. Apparatus as defined in claim 37, wherein the comparison circuit comprises:
an upper limit digital to analog converter for converting digital upper limit signals supplied by the probe processor to analog upper limit reference signals;
a lower limit digital to analog converter for converting digital lower limit signals supplied by the probe processor to analog lower limit reference signals;
an upper limit comparator for comparing signals sensed by the probe to the upper limit reference signals;
a lower limit comparator for comparing signals sensed by the probe to the lower limit reference signals;
an upper limit flip-flop responsive to a sampling pulse for providing results of the upper limit signal comparison to the probe processor; and
a lower limit flip-flop responsive to a sampling pulse for providing results of the lower limit signal comparison to the probe processor.

42. Apparatus as defined in claim 29, wherein:
the probes are operable such that electromagnetic emission from respective regions of the circuit board near each probe can be sensed simultaneously; and the signal analyzer is operable such that time domain representations of the electromagnetic emission sensed from plural regions are developed simultaneously and compared simultaneously to respective time domain representations of electromagnetic emission of a circuit board known to be operating properly.

43. Apparatus as defined in claim 42, wherein the signal analyzer comprises a plurality of signal analysis elements, each signal analysis element being connected to a respective probe for analysis of signals sensed by that probe.

44. Apparatus as defined in claim 42, wherein the signal analyzer comprises a plurality of signal analysis elements, each signal analysis element being connected to a respective group of probes via a multiplexor, the multiplexor being operable by the controller for successively sensing and processing signals on each probe in the respective group of probes.

45. Apparatus as defined in claim 29, wherein the signal analyzer comprises a single signal analysis element connected to all of the probes via a multiplexor, the multiplexor being operable by the controller for successively sensing and processing signals on each probe.

46. Apparatus as defined in claim 43, wherein each signal analysis element and its respective probe has a respective carrier, the carriers being mountable in close proximity to form a dense array of probes.

47. Apparatus as defined in claim 44, wherein each signal analysis element and its respective group of probes have a respective carrier, the carriers being mountable in close proximity to form a dense array of probes.

* * * * *